United States Patent
Phan Le et al.

(10) Patent No.: US 8,395,382 B2
(45) Date of Patent: Mar. 12, 2013

(54) NON-LINEAR MAGNETIC FIELD SENSORS AND CURRENT SENSORS

(75) Inventors: Kim Phan Le, Eindhoven (NL); Jaap Ruigrok, Asten (NL)

(73) Assignee: NXP B.V. (NL)

( * ) Notice: Subject to any disclaimer, the term of this patent is extended or adjusted under 35 U.S.C. 154(b) by 936 days.

(21) Appl. No.: 11/577,090

(22) PCT Filed: Oct. 10, 2005

(86) PCT No.: PCT/IB2005/053306
§ 371 (c)(1),
(2), (4) Date: Jul. 7, 2009

(87) PCT Pub. No.: WO2006/040719
PCT Pub. Date: Apr. 20, 2006

(65) Prior Publication Data
US 2009/0302837 A1    Dec. 10, 2009

(30) Foreign Application Priority Data
Oct. 11, 2004  (EP) ...................... 04104963

(51) Int. Cl.
*G01R 33/02* (2006.01)
*G01R 33/00* (2006.01)
(52) U.S. Cl. ............... 324/252; 324/260; 324/244
(58) Field of Classification Search .......... 324/244, 324/252, 260
See application file for complete search history.

(56) References Cited

U.S. PATENT DOCUMENTS

| | | | |
|---|---|---|---|
| 5,963,038 | A | 10/1999 | De Jong et al. |
| 6,731,105 | B1 | 5/2004 | Hoyle et al. |
| 2002/0158626 | A1 | 10/2002 | Shay et al. |
| 2003/0157368 | A1 | 8/2003 | Van Dau et al. |
| 2004/0021461 | A1 | 2/2004 | Goldfine et al. |
| 2004/0066674 | A1 | 4/2004 | Tang et al. |
| 2004/0137275 | A1 | 7/2004 | Jander et al. |
| 2004/0155644 | A1 | 8/2004 | Stauth et al. |
| 2004/0159488 | A1 | 8/2004 | Matsumoto et al. |
| 2004/0164840 | A1 | 8/2004 | Xiao et al. |

FOREIGN PATENT DOCUMENTS

| | | |
|---|---|---|
| EP | 1225453 A2 | 7/2002 |
| EP | 0304937.2 | 12/2003 |
| GB | 2372574 A | 8/2002 |
| WO | 03049988 A1 | 6/2003 |

OTHER PUBLICATIONS

International Search Report dated Feb. 3, 2006, PCT/IB2005/053306.

*Primary Examiner* — Reena Aurora
(74) *Attorney, Agent, or Firm* — Kramer & Amado P.C.

(57) ABSTRACT

The invention provides a magnetic field sensor or current sensor which can exhibit a substantially linear relationship between the sensor signal and the logarithm of the magnetic field or current. The sensor may be used as a wide dynamic range sensor which can offer a constant relative sensitivity and a uniform SNR over several decades. The design of the sensor device may be implemented in discrete magnetic field sensors or current sensors as well as in integrated current sensors in ICs comprising MRAM modules.

20 Claims, 9 Drawing Sheets

NON-LINEAR MAGNETIC FIELD SENSORS AND CURRENT SENSORS

The present invention relates to sensors, and more particular to non-linear sensors, for example those exhibiting a substantially linear relationship between the sensor signal and the logarithm of the property measured by the sensor and which can be used as a wide dynamic range sensor offering a constant relative sensitivity and a uniform SNR over several decades.

Magnetoresistive (MR) sensors are, by definition, linear sensors within the measuring range. The most widely used types of MR sensors in medium and low field range are based on anisotropic magnetoresistive (AMR), giant magnetoresistive (GMR) or recently tunnel magnetoresistive (TMR) effects.

In principle, one type of "good" magnetic sensor is a sensor which exhibits a linear characteristic within a field range of detection, beyond which the sensor signal is saturated. Consequently, sensitivity of a sensor, which is determined by the slope of the linear part of characteristic, is negatively correlated with the detection range. The sensitivity and field range can be tuned to meet requirements of different applications by, for example, tailoring the sensor design.

For example, different members of the Philips' AMR-based KMZ field sensors family can provide different detection ranges, from 0.05 kA/m up to 100 kA/m. The wider the detection range, the lower the sensitivity becomes. Similarly, conventional electric current sensors based on magneto-resistance effects can provide a linear relationship between sensor signal and electric current. For instance the commercialized current sensors from F. W. Bell provide linear current ranges from a few Amperes up to 150 A with of course rather low sensitivity. Recently we proposed a very sensitive integrated current sensor for IC testing using TMR effect whose detection range can go down to mA or tens of mA range (see European application with application number EP 03104937.2, "High sensitivity magnetic built-in current sensor"). The technology used for this integrated sensor is similar to the common MRAM technology, allowing implementation of the sensors without significantly extra cost.

Figure 1:
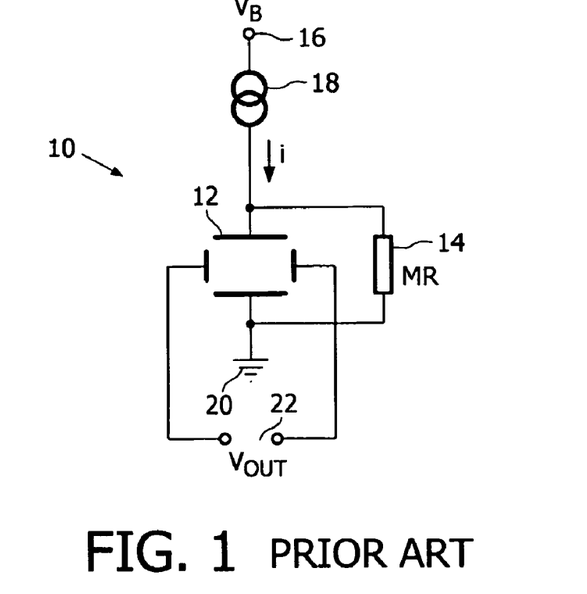
FIG. 1 is a schematic representation of a magneto-resistor shunt utilized with a Hall effect sensor according to the prior art.

In EP 1 225 453 a circuit and method of providing desired response from magnetic field sensors to a predetermined magnetic function is described. The document relates to multiple magnetic field sensors which are combined in a single magnetic sense circuit to provide a tailored response according to the desired function of magnetic field density, such as a function of angle, or position. The magnetic field sensors are chosen based on output characteristics and combined in configurations so as to provide offsetting sensor errors that essentially cancel out the errors within one another so as to provide a linear response. FIG. 1 illustrates one embodiment of a magnetic sensor circuit 10, described in EP 1 225 453, in which a Hall effect sensor 12 is configured with a magneto-resistor shunt 14. A bias voltage VB 16 drives current from a constant current source 18 to the Hall effect sensor 12 which is connected to ground 20. The magneto-resistor 14 is connected across the Hall effect sensor 12 so that the resistance of the magneto-resistor 14 provides a shunt across the Hall effect sensor 12, and circuit output is provided at VOUT 22.

Figure 2:
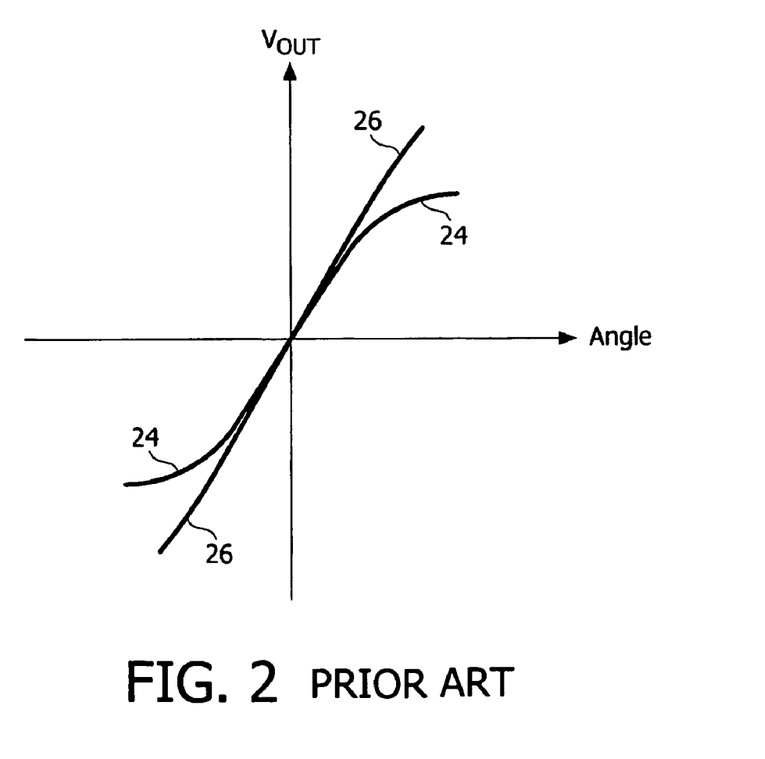
FIG. 2 is a graph of circuit voltages for the circuit according to FIG. 1 in response to angular rotation shown with and without the magneto-resistor shunt.

In FIG. 2, a graph of the voltage outputs in response to the angular position for the circuit illustrated in FIG. 1 is shown, plotted with and without the use of the magneto-resistor shunt. In measuring angular position, for instance within angle encoder applications, the magnetic field density follows a sinusoidal function. Curve 24 shows the relationship between the output voltage of the Hall effect sensor 12 and the angle for an individual Hall effect sensor 12 without a magneto-resistor shunt 14. The addition of a magneto-resistor shunt 14 to create the circuit of FIG. 1, tailors the response of the Hall effect sensor 12 and results in a voltage response depicted by curve 26 in FIG. 2. Subject to low values of field density B of either polarity, the magneto-resistor shunt 14 exhibits a relatively low resistance and thereby diverts a substantial portion of the total drive current away from the Hall effect sensor 12. As the field strength increases the resistance of the magneto-resistor 14 increases more readily than the resistance of the Hall effect sensor 12, such that less current is diverted thereby boosting the output of the Hall effect sensor 12 accordingly. These offsetting effects in response to the sinusoidal magnetic field density act in concert to straighten the response curve, as can be appreciated from the two comparative plots within FIG. 2. The use of the magneto-resistor shunt 14 coupled with a Hall effect sensor 12, therefore, provides a significant improvement to the linearization of the Hall effect sensor 12 when resolving a magnetic field that follows a sinusoidal function.

However, in some applications logarithmic characteristic may be required, for example when the quantity or property to be measured is spread over a wide dynamic range of several decades or exponential phenomena are involved, such as measurements of chemical concentration, measurements of pressure and vacuum, photo-emission, etc. Alternatively, in other applications, equally good sensitivity and SNR may be needed over a wide dynamic range of magnetic field or current.

In general, a logarithmic sensor is a sensor that gives a substantially linear or quasi-linear relationship between the sensor signal and the logarithm of the quantity or property to be measured. A known way to construct a logarithmic sensor using a linear sensor is to convert its linear characteristic into logarithmic characteristic using external electronics. However, this way often results in bad SNR at lower decades.

It is an object of the present invention to provide a logarithmic sensor which can be used as a wide dynamic range sensor which can offer a constant relative sensitivity and a uniform SNR over several decades as well as a method of manufacturing and operating the same.

The above objective is accomplished by a method and device according to the present invention.

The present invention provides a sensor device comprising at least two magnetic sensor elements connected in series or in parallel, each magnetic sensor element having a sensitivity, wherein the sensitivity of each magnetic sensor element differs from the sensitivity of any other magnetic sensor element. The sensitivity of a magnetic sensor element may be defined as the slope of the linear characteristic of the sensor element.

In the sensor device according to the invention, each of the at least two sensor elements may output a sensor signal over a range of a sensed parameter and the sensor device may output a sensor signal over a total range of said sensed parameter. The sum of each of the sensor signals of the at least two magnetic sensor elements may fit to a non-linear function of the sensed parameter over the total range of the sensor device. The non-linear function may be a logarithmic or quasi-logarithmic function. It is an aspect of the present invention to obtain a sensor output signal which shows a non-linear relationship between the sensor signal and the measured property, e.g. a substantially linear relationship between the sensor signal and the logarithm of the measured property. The measured property can be, for example, a magnetic field or current. This type of sensor may be achieved by tuning the sensitivity of each of the at least two magnetic sensor elements.

The sensor device according to the invention may be applied as discrete magnetic field sensor which can sense a wide dynamic range of field over several decades and as discrete current sensor which can sense a wide dynamic range of current. The sensor device of the invention may furthermore be applied as integrated current sensor which can sense a wide dynamic range of current and in any application that need to sense non-invasively a current which is converted from a quantity to be measured and this quantity varies exponentially e.g. with time.

According to one embodiment of the invention, each of the at least two magnetic sensor elements may have the same geometry and size. In another embodiment the at least two magnetic sensor elements may have a different geometry and size. By changing the size and/or geometry of at least one of the at least two sensor elements, magnetic sensor elements may be obtained with a different sensitivity. In another embodiment, at least one of the two magnetic sensor elements may be split into at least two sub-elements connected to each other in parallel or in series. Splitting of at least one of the sensor elements gives more freedom of tuning sensitivity and area (for tuning resistance) simultaneously. The sub-elements preferably may have identical dimensions, because the same saturation field is required and therefore the sub-elements need equal shape anisotropy.

In other embodiments, the device may furthermore comprise a conductor line positioned under the at least two magnetic sensor elements. In some embodiments according to the invention, the conductor line may show a different width at the position of at least one of the at least two magnetic sensor elements. To change the sensitivity of the sensor element, one can change the field applied to the sensor element by changing the conductor line width. For example, to reduce the sensitivity of the sensor element, one can reduce the field applied to the sensor element by widening the conductor line width.

The sensor device according to the invention may furthermore comprise a by-pass current path. In this embodiment, the current to be measured may be split into several parallel conduction paths, called by-pass current path, at the location of at least one sensor element where the current sensitivity needs to be very small, among which only one path flows in the proximity of the element.

In still another embodiment, the sensor device may comprise at least one magnetic shield. The at least one magnetic shield may be placed in the vicinity of at least one magnetic sensor element. The at least one magnetic shield may for example be made of a soft magnetic material such as e.g. permalloy. The effectiveness of the shield in reducing the applied field may be characterized by the shielding factor F. Hence, in order to tune the sensitivity, the shielding factor F may be varied. This may be done by for example tuning the geometry of the shield.

In the present invention includes within its scope that any combination of properties for tuning the sensitivity of a magnetic sensor element as described hereinabove may be used for forming a sensor device according to the invention comprising at least two magnetic sensor elements, each magnetic sensor element having a different sensitivity.

In a further aspect of the invention, a method is provided for the manufacturing of a sensor device. The method comprises providing at least two magnetic sensor elements connected in series or in parallel, each magnetic sensor element having a sensitivity whereby the sensitivity of the at least two magnetic sensor elements is set such that the sensitivity of each magnetic sensor element differs from the sensitivity of any other of the magnetic sensor elements.

The sensitivity of each of the at least two magnetic sensor elements may be tuned in different ways. In a first embodiment, setting the sensitivity of the at least two magnetic sensor elements may be performed by changing the geometry and/or size of the at least two magnetic sensor elements.

In another embodiment, setting the sensitivity of the at least two magnetic sensor elements may be performed by splitting up at least one of the at least two magnetic sensor elements. Splitting of at least one of the sensor elements gives more freedom of tuning sensitivity and area (for tuning resistance) simultaneously. The sub-elements preferably may have identical dimensions, because the same saturation field is required and therefore the sub-elements need equal shape anisotropy.

In still another embodiment, setting the sensitivity of the at least two magnetic sensor elements may be performed by providing a magnetic shield in the vicinity of at least one of the at least two magnetic sensor elements. The at least one magnetic shield may for example be made of a soft magnetic material such as e.g. permalloy. The effectiveness of the shield in reducing the applied field may be characterized by the shielding factor F. Hence, in order to tune the sensitivity, the shielding factor F may be varied. This may be done by for example tuning the geometry of the shield.

In a further embodiment according to the invention, a conductor line may be provided under the at least two magnetic sensor elements. In some embodiments according to the invention, the conductor line may be provided such that it shows a different width at the position of at least one of the at least two magnetic sensor elements. To change the sensitivity of the sensor element, one can change the field applied to the sensor element by changing the conductor line width. For example, to reduce the sensitivity of the sensor element, one can reduce the field applied to the sensor element by widening the conductor line width.

Any combination of the above described methods for changing or setting the sensitivity of magnetic sensor elements may be used according to the invention.

Although there has been constant improvement, change and evolution of devices in this field, the present concepts are believed to represent substantial new and novel improvements, including departures from prior practices, resulting in the provision of more efficient, stable and reliable devices of this nature.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

In the different figures, the same reference signs refer to the same or analogous elements.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

The present invention provides a method of manufacturing a sensor device 30 which exhibits a non-linear relationship between the sensor signal and the property to be measured, e.g. a substantially linear or quasi-linear relationship between the sensor signal and the logarithm of the measured property and a sensor device 30 obtained by such a method. The property to be measured may be, for example, a magnetic field or current. The sensor device 30 according to the invention may be used as a wide dynamic range sensor which can offer a constant relative sensitivity and a uniform SNR over several decades. The proposed design of the sensor device 30 according to the invention can be applied to discrete magnetic field sensors or current sensors as well as to integrated current sensors in integrated circuits comprising MRAM modules. In the further description the invention will be described by means of a TMR sensor device. It has, however, to be understood that this is only for the ease of explaining and that this is not limiting to the invention. The present invention may also be applied to, for example, AMR and GMR sensors.

Basically, the logarithmic or quasi-logarithmic sensor device 30 proposed in this invention is a system comprising at least two linear magnetoresistive sensors having different sensitivities and being connected in series or parallel. The sensitivity of each of the at least two linear magneto-resistive sensors may be set in different ways as will be described hereinafter.

Figure 3:
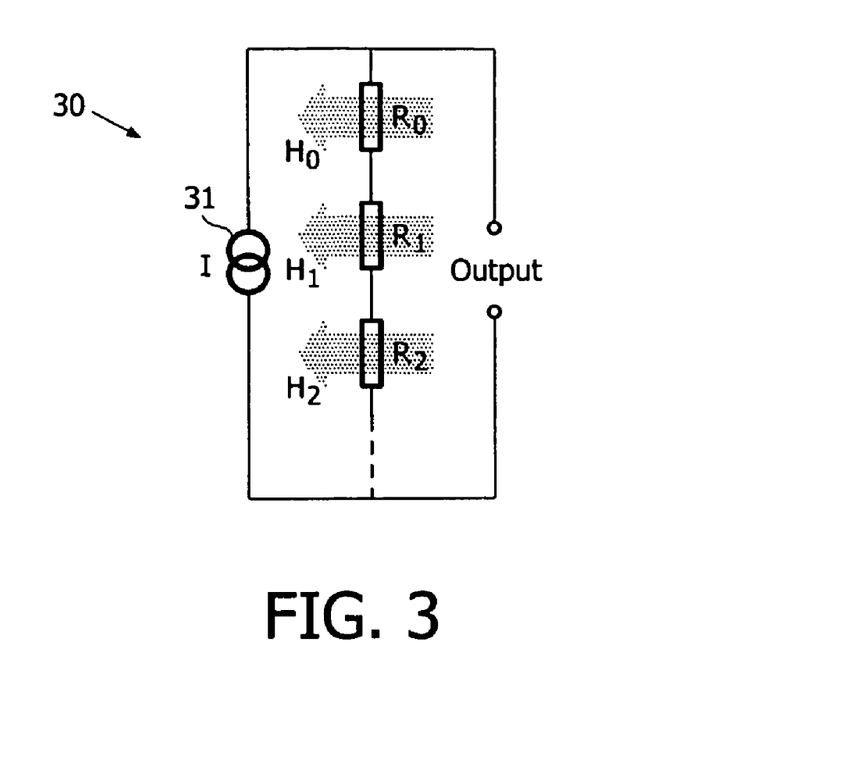
FIG. 3 shows a circuit diagram of a sensor device according to an embodiment of the present invention.
Figure 4:
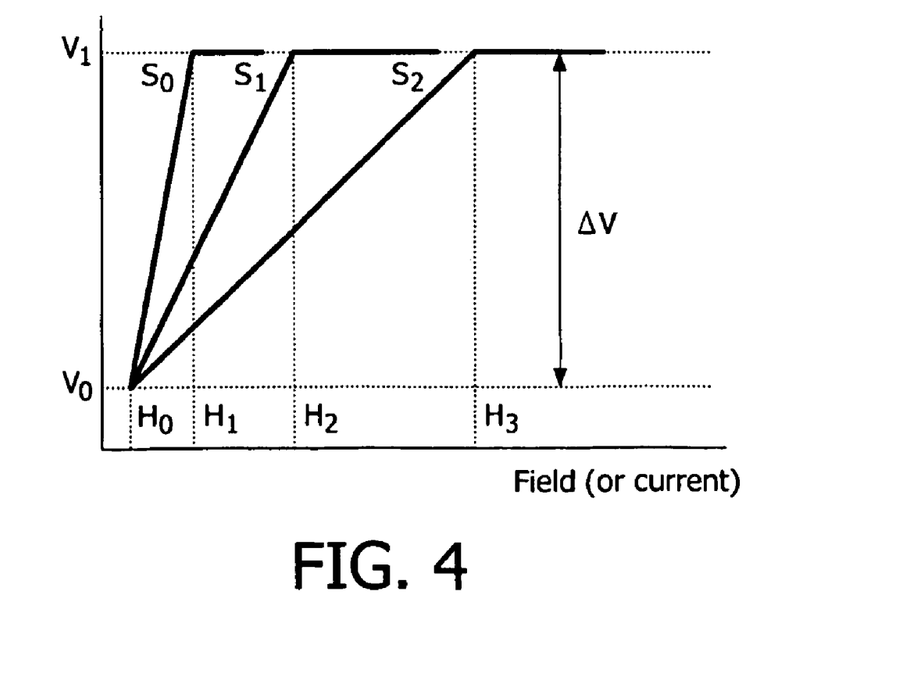
FIG. 4 is a graph illustrating the individual behaviours of the different elements in the circuit diagram of FIG. 3.

In one embodiment, a sensor device 30 is provided comprising a plurality of n sensor elements $R_0, R_1, \ldots, R_{n-1}$ which are connected in series and wherein n is an integer $\geq 2$. As an example, a sensor device 30 according to the invention is illustrated in FIG. 3. For the ease of explanation, the sensor device 30 in FIG. 3 only comprises three sensor elements $R_0$, $R_1$, $R_2$. The system is fed by a current source 31 and the output voltage is measured on the terminals of the current source 31. According to the invention, each sensor element $R_0$, $R_1$, $R_2$ has a different voltage versus field or current characteristic, as is illustrated in FIG. 4, which shows the individual behaviour of the different sensor elements $R_0$, $R_1$, $R_2$. Each sensor element $R_0$, $R_1$, $R_2$ exhibits linear characteristics at fields below their saturation fields $H_1$, $H_2$, $H_3$ and becomes saturated at fields larger than these values $H_1$, $H_2$, $H_3$. Preferably, the sensor elements $R_0$, $R_1$, $R_2$ may be designed such that their resistances at zero field are equal and their full resistance changes are the same. It has, however, to be noted that the present invention is not limited to equal resistances and that each sensor element $R_0$, $R_1$, $R_2$ may, although this is less advantageous, have a different resistance, even though in this case an optimum operation can not be guaranteed.

For, for example, TMR sensors, equal resistances may be obtained by keeping the area of the sensor elements $R_0$, $R_1, \ldots, R_{n-1}$ the same, even though their aspect ratios can be different.

Figure 5:
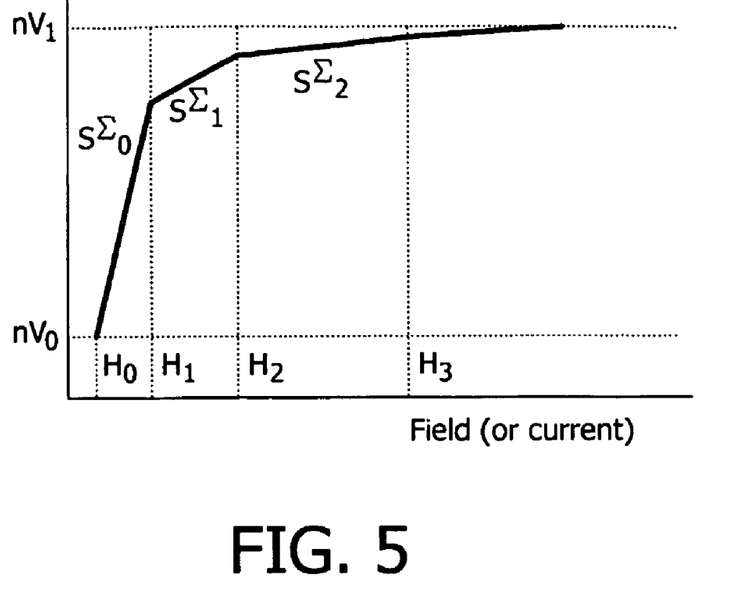
FIG. 5 is a graph illustrating the total signal of the sensor device according to FIG. 3.
Figure 6:
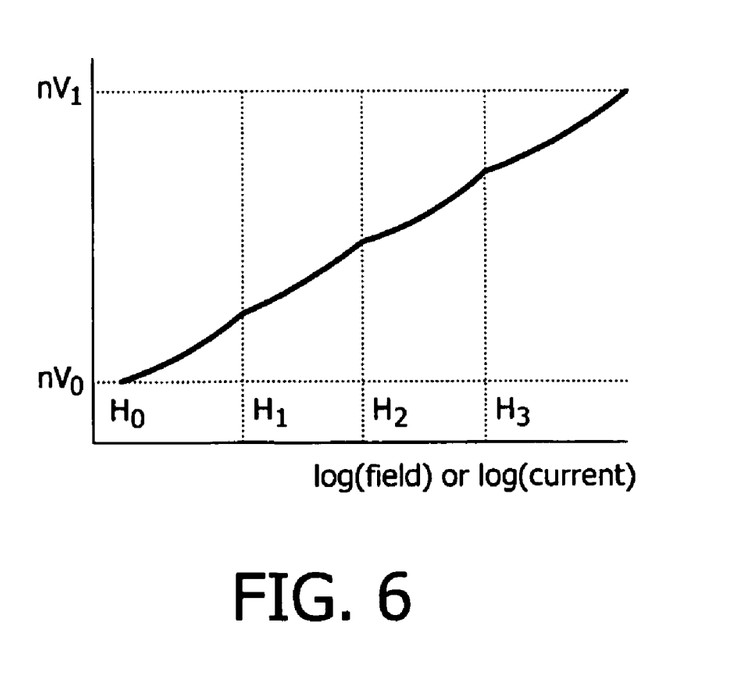
FIG. 6 is a semi-log graph of the total signal of the sensor device according to FIG. 3.

According to the present invention, the sensitivities $S_0, S_1, S_2 \ldots S_{n-1}$ of the different sensor elements $R_0, R_1, \ldots, R_{n-1}$ forming the sensor device 30, which sensitivities $S_0, S_1, S_2 \ldots S_{n-1}$ are defined as the slopes of the linear characteristics of each sensor element $R_0, R_1, \ldots, R_{n-1}$, must satisfy the following relationship: $S_0 > S_1 > S_2 > \ldots > S_{n-1}$, i.e. each of the magnetic sensor elements $R_0, R_1, \ldots, R_{n-1}$ should have a different sensitivity, and what is still more important, the sum of all individual signals taken on the output of the sensor device 30 must fit to a non-linear, or more important, to a quasi-log function (see FIG. 5). When plotting the field in a log-scale, a quasi-linear characteristic curve, as shown in FIG. 6, should be obtained. As can be seen in FIG. 6, each segment of the curve does not form a perfect line but is slightly bowed, which is due to the conversion from linear to log-scale. However, as will be discussed further in the description, in reality, the individual characteristic curves are normally rounded off near the onset of saturation, resulting in a smoother total signal curve and consequently the real characteristic curve in log-scale plot would be closer to a straight line. It should be noted that due to the property of the log function, the start field $H_0$ in principle cannot be zero, but may in practice be a very small value of for example smaller than 1 Oe.

When studying the operation of the sensor device 30 as illustrated in FIG. 3 and FIG. 4, it can be noticed that at the lowest field range from $H_0$ to $H_1$, the total signal is the sum of all linear slopes of the individual elements and is dominated by the sensor with the highest sensitivity $S_0$ (sensor $R_0$). Therefore, this part has the steepest slope. At a field from $H_1$ to $H_2$, $R_0$ is saturated and hence, its signal no longer contributes to the change in the total signal. The total slope now is drastically reduced and is dominated by the second highly sensitive element $R_1$, and so on. Finally at the highest field range where all elements are saturated except for the least sensitive one, $R_{n-1}$, the total signal is only influenced by the signal from $R_{n-1}$ and thus has a slope of $S_{n-1}$. By constructing a sensor device 30 according to this embodiment of the invention, the total dynamic range of the sensor device 30 is split into a number of segments. Each sensor element $R_0, R_1, \ldots, R_{n-1}$ is mainly responsible for a certain segment at which it has the best-fit sensitivity. For an optimal choice of the segments, the relative sensitivity of the sensor device 30 may be quite constant and a uniform SNR is obtained over several decades.

In order to obtain a log function at the output of the sensor device 30, each sensor element $R_0, R_1, \ldots, R_{n-1}$ must have a defined sensitivity $S_0, S_1, S_2 \ldots S_{n-1}$. Because these sensitivities $S_0, S_1, S_2 \ldots S_{n-1}$ are added up, they must be well linked to each another. Hereinafter, a way for defining these values will be discussed.

It is supposed that at the output of a sensor device 30 a logarithmic function is to be obtained which must satisfy the following relation:

$$V = (a \times \log H) + b; \quad (1)$$

in which V is the total signal voltage of the sensor, H is the field to be measured and a and b are two parameters of the function. Equation (1) applies for field sensors. Further calculations will be performed for field sensors, but are not limited to field sensors. It has to be noted that in case of current sensors, H must be replaced by I, which is the current to be measured. The slope of the curve at any field H is:

$$dV/dH = (a \times \log e)/H; \quad (2)$$

It is required that the total signal of all sensor elements $R_0, R_1, \ldots, R_{n-1}$ follow equation (1). However, each segment of the total signal curve, being a sum of linear characteristics, is in fact a straight line and therefore, in principle, they can only form a quasi-log function. The deviation from the ideal log function can be reduced by adding more segments, and thus by adding more sensor elements $R_0, R_1, \ldots, R_{n-1}$ to the sensor device 30.

It is assumed that the slope of each segment of the total signal curve is approximately equal to the slope defined in equation (2) at the start field of that segment. Hence, the slope of the first segment (from $H_0$-$H_1$), being the sum of all individual slopes of the sensor elements $R_0, R_1, \ldots, R_{n-1}$, can be expressed as:

From $H_0$ to $H_1$:

$$S^\Sigma_0 = S_0 + S_1 + S_2 + \ldots + S_{n-1} = (a \times \log e)/H_0; \quad (3)$$

When the field is larger than $H_1$ and smaller than $H_2$, the first element $R_0$ is saturated. The total slope is the sum of all slopes, except $S_0$:

From $H_1$ to $H_2$:

$$S^\Sigma_1 = 0 + S_1 + S_2 + \ldots + S_{n-1} = (a \times \log e)/H_1; \quad (4)$$

With $H_1 = (\Delta V + S_0 H_0)/S_0$, in which $\Delta V = V_1 - V_0$, equation (4) becomes:

$$S_1 + S_2 + \ldots + S_{n-1} = \frac{a \times \log e \times S_0}{\Delta V + S_0 H_0} \quad (5)$$

From $H_2$ to $H_3$, both $R_0$ and $R_1$ are saturated therefore their slopes $S_0$ and $S_1$ disappear from the sum:

$$S^\Sigma_2 = 0 + 0 + S_2 + \ldots + S_{n-1} = a \times \log e/H_2; \quad (6)$$

Similar to equation (5), equation (6) can be written as:

$$S_2 + \ldots + S_{n-1} = \frac{a \times \log e \times S_1}{\Delta V + S_1 H_0}; \quad (7)$$

And so on . . . .

In general, a system of n equations is achieved:

$$\text{For } i = 0: \sum_{k=0}^{n-1} S_k = \frac{a \times \log e}{H_0}; \quad (8)$$

$$\text{For } 1 \leq i \leq n-1: \sum_{k=i}^{n-1} S_k = \frac{a \times \log e \times S_{i-1}}{\Delta V + S_{i-1} H_0} \quad (9)$$

This equation system has n unknowns, i.e. a, $S_1, \ldots, S_{n-1}$, that need to be solved.

By subtracting one equation from a next equation (i.e. equation $i^{th}$-equation $i-1^{th}$), the following equation can be obtained:

$$a = \frac{S_0}{\log e \left( \frac{1}{H_0} - \frac{S_0}{\Delta V + S_0 H_0} \right)} \quad (10)$$

and $S_i$ (with i from 1 to n−1) is the positive solution of the following quadratic equations:

$$H_0 S_i^2 + \left( \Delta V + a \log e - \frac{a \log e S_{i-1} H_0}{\Delta V + S_{i-1} H_0} \right) S_i - \frac{a \log e S_{i-1} \Delta V}{\Delta V + S_{i-1} H_0} = 0 \quad (11)$$

From the solutions it can be seen that the first slope $S_0$ is a parameter which can be chosen and from that the parameter "a" of the log function and the rest of slopes ($S_i$, i from 1→n−1) may be uniquely defined. Alternatively, parameter "a" may be considered a known parameter (e.g. a requirement) and $S_0$ and $S_i$ can be determined from solving equations (10) and (11), respectively. Equation (11) must be solved in an ascending order, because to solve $S_i$ one needs to know $S_{i-1}$.

In principle, to build a sensor device 30 which can cover lower detection limit, element $R_0$ must be designed such that it has an as high as possible sensitivity. The rest of the sensor elements $R_1, R_2, \ldots R_{n-1}$ may then have lower sensitivities $S_1, S_2 \ldots S_{n-1}$.

To demonstrate the principle, a simulation will be given hereinafter. In this simulation, it is assumed that a sensor device 30 comprises six sensor elements $R_0$ to $R_5$ connected in series. The first element, $R_0$, may have a sensitivity $S_0$ of 4%/Oe, which is equivalent to $8 \times 10^{-3}$ V/Oe. This is a typical value for a good TMR sensor. Other input parameters may be: $\Delta V = 0.04$V, $V_0 = 0.2$V and $H_0 = 1$ Oe.

Solving equations (10) and (11) results in:

$$a = 2.21 \times 10^{-2};$$

$$S_1 = 1.3 \times 10^{-3} (V/Oe),$$

$$S_2 = 2.44 \times 10^{-4} (V/Oe),$$

$$S_3 = 4.69 \times 10^{-5} (V/Oe),$$

$$S_4 = 9.06 \times 10^{-6} (V/Oe), \text{ and}$$

$$S_5 = 1.75 \times 10^{-6} (V/Oe)$$

From the values for the slope $S_0$ to $S_5$ determined from the calculations, it has to be noticed that the slopes $S_0$ to $S_5$ vary over a wide range, approximately the same number of decades as the dynamic range of the sensor device 30. However, it will be shown later that varying the slope over a wide range is in practice not at all trivial.

The individual characteristic curves are supposed to have a rounded-off shape, which is closer to practice. A sigmoidal function is used to simulate the characteristic curves:

$$y = y_0 + \frac{\alpha}{1 + \exp\left(-\frac{x-x_0}{\beta}\right)} \quad (12)$$

The maximum slope (at $x=x_0$) is $\alpha/4\beta$. This slope will be replaced by $S_0$ to $S_5$ obtained from the above calculations.

Figure 7:
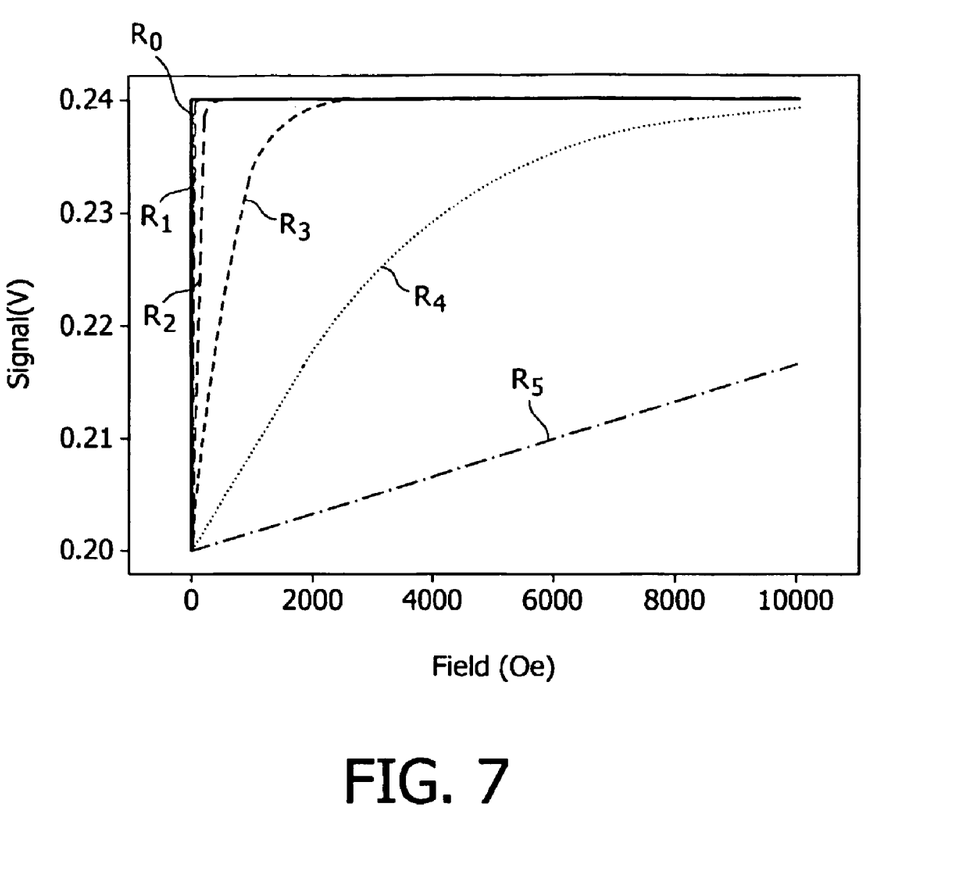
FIG. 7 is a graph showing a simulation of the individual characteristics of six different elements forming a sensor device according to an embodiment of the present invention.
Figure 8:
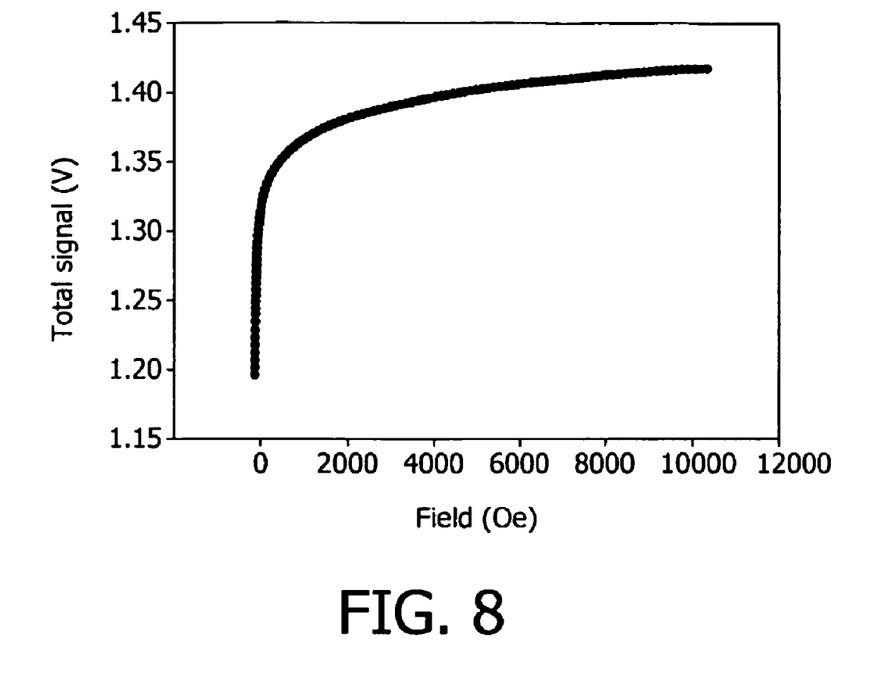
FIG. 8 is a graph illustrating the total signal for the sensor device comprising six different elements according to FIG. 7.
Figure 9:
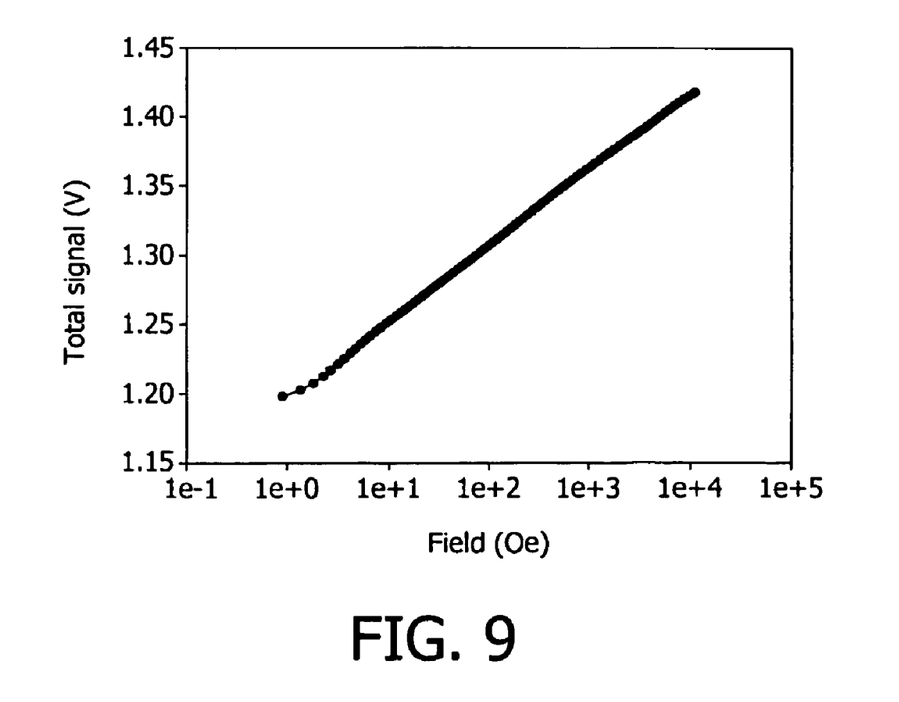
FIG. 9 is a semi-log graph of the total sensor signal illustrated in FIG. 8.

FIG. 7 shows the individual characteristics of the six sensor elements $S_0$ to $S_5$. The total signal obtained by adding up all individual signals is presented in FIG. 8. When plotted in semi-log scale (see FIG. 9), the total signal curve exhibits a straight line, except for a slight bow at the first segment. This indicates that a good log-function characteristic can be achieved. In this example, the sensor device 30 can provide a logarithmic behaviour over four decades of field.

On the one hand, increasing sensitivity of the first sensor element $S_0$ will extend the range to lower decades, and at the same time, the linearity in the log-scale plot of the first segment will be improved. On the other hand, adding more sensor elements $R_0, R_1, \ldots, R_{n-1}$ will extend the field range to higher decades. However, there are limitations for extending the dynamic range to both low and high ends. In practice, the highest sensitivity is limited by the available technology. On the other hand, for extending to the high ends, adding more sensor elements $R_0, R_1, \ldots, R_{n-1}$ requires a very low sensitivity of some higher numbered sensor elements. The lower sensitivity would add more complication to the device structure and is not always easy to achieve. These issues will be further discussed hereinafter.

Figure 10:
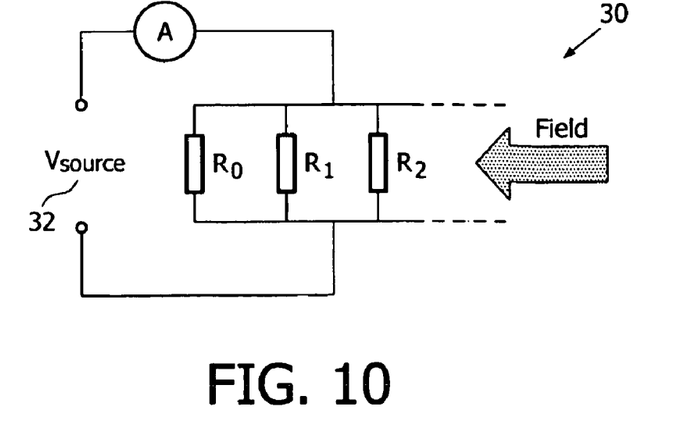
FIG. 10 illustrates a parallel connection scheme of a sensor device according to an embodiment of the present invention.

Alternatively, in another embodiment according to the invention, the sensor device 30 may comprise a number n of sensor elements $R_0, R_1, \ldots, R_{n-1}$ which may be connected in parallel, as illustrated in FIG. 10. The sensor elements $R_0, R_1, \ldots, R_{n-1}$ are fed by a voltage source 32 and the total current is measured as the output signal of the sensor device 30. Calculations for sensitivities of the sensor elements $R_0, R_1, \ldots, R_{n-1}$ are similar to those as discussed for the first embodiment of the invention. The sensor elements $R_0, R_1, \ldots, R_{n-1}$ may, for example, also be connected in the configuration of a Wheatstone bridge for better immunity against external disturbances such as temperature change.

The present invention may thus be used both for current sensors and magnetic field sensors. In both cases, it is required that the sensitivities $S_0, S_1, S_2 \ldots S_{n-1}$ of the sensor elements $R_0, R_1, \ldots, R_{n-1}$ are being well tuned. There are a number of ways to tune the sensitivity $S_0, S_1, S_2 \ldots S_{n-1}$, as will be described in the next sections.

The sensitivity of a sensor device 30, i.e. the slope of the linear part of the voltage versus field (or current) graph, is inversely proportional to the anisotropy of the sensing layer of the sensor elements $R_0, R_1, \ldots, R_{n-1}$:

$$S = MR_{max} \mu_0 M_s / (4K) \quad (13)$$

in which $MR_{max}$ is the maximum magneto-resistance change of the sensor (%), $\mu_0$ is the permeability of vacuum, $M_s$ is the saturation magnetization of the sensing material and K is the anisotropy constant of the sensing layer.

The anisotropy of the sensing layer of the sensor elements $R_0, R_1, \ldots, R_{n-1}$ which may typically be made of permalloy, is an algebraic sum of the shape anisotropy and the crystalline anisotropy. The crystalline anisotropy is an intrinsic property of the material, which cannot be changed locally, whereas the shape anisotropy depends on the geometry of the sensor element $R_0, R_1, \ldots, R_{n-1}$, and thus can be varied. The shape anisotropy energy density $K_{shape}$ can be expressed as:

$$K_{shape} = (1/2) \mu_0 M_s^2 (N_x - N_y) \quad (14)$$

in which $N_x$ and $N_y$ are the demagnetization factors along the easy axis and hard axis, respectively, which depend merely on the geometry of the element. For large sensor elements $R_0, R_1, \ldots, R_{n-1}$, i.e. larger than several μm, the shape anisotropy can be approximated as:

$$K_{shape} = (1/2) \mu_0 M_s^2 / w \quad (15)$$

in which t and w are the thickness and the width of the sensing layer of the sensor elements $R_0, R_1, \ldots, R_{n-1}$, respectively.

To increase the sensitivity of the sensor device 30 the anisotropy may be reduced by, for example, reducing the layer thickness of the sensing layer of the sensor elements $R_0, R_1, \ldots, R_{n-1}$ or by reducing the aspect ratio of the sensor elements $R_0, R_1, \ldots, R_{n-1}$. However, a too small anisotropy will result in significant hysteresis and will destabilize the magnetic patterns in the sensing layer.

To decrease the sensitivity, the (shape) anisotropy of the sensing layer of the sensor elements $R_0, R_1, \ldots, R_{n-1}$ can be increased by, for example, decreasing the width of the sensor element $R_0, R_1, \ldots, R_{n-1}$. Theoretically, a maximum shape anisotropy of $K_{shape} = (1/2) \mu_0 M_s^2$ may be obtained for $N_y \to 1$ and consequently for Nx and Nz→0 (because Nx+Ny+Nz=1). Theoretically, this means that the shape anisotropy can be varied over about 3 decades. Due to technological requirements and desires like minimal possible lateral dimensions during structuring and maximum allowed layer thickness, the practical range will considerably be smaller.

Alternatives and subsidiary means for reducing the sensitivity of higher numbered sensor elements will be discussed hereinafter.

Figure 11:
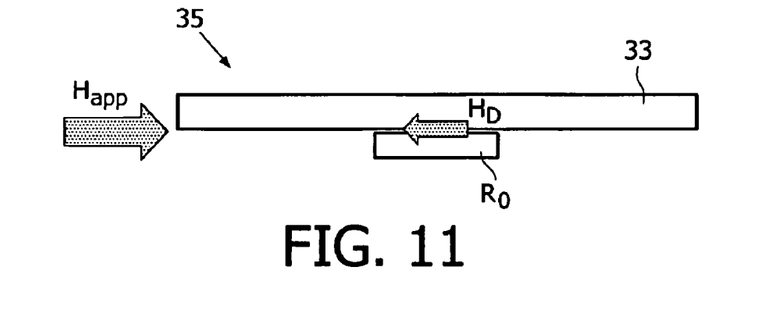
FIG. 11 shows a side view of a shield-sensor device according to an embodiment of the present invention in an applied magnetic field.
Figure 12:
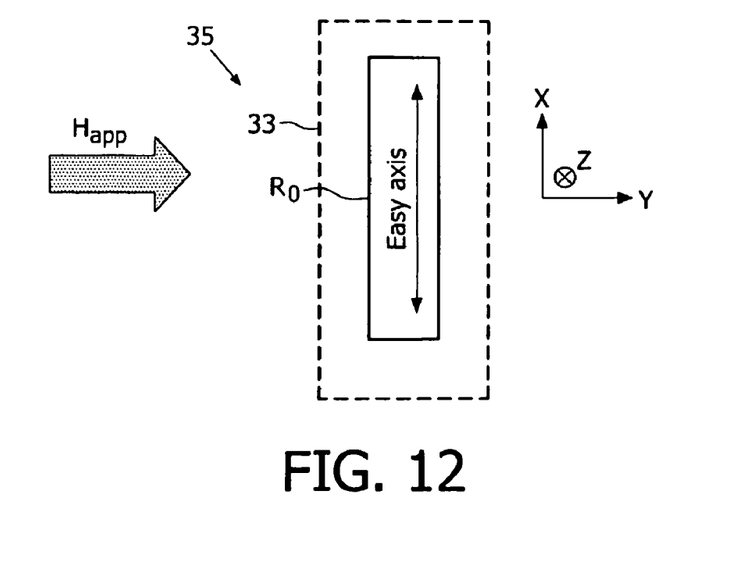
FIG. 12 shows a top view of the shield-sensor device according to FIG. 11.

The sensitivity of a sensor element $R_0, R_1, \ldots, R_{n-1}$ may be reduced by reducing the applied magnetic field (see FIG. 11 and FIG. 12). This may be done by, for example, placing magnetic shields 33 in the proximity of the sensor elements $R_0, R_1, R_{n-1}$. Such a shield 33 may for example be made of a soft magnetic material such as e.g. permalloy. The effectiveness of the shield 33 in reducing the applied field may be characterized by the shielding factor F, which may be defined as the ratio of the applied field when the shield 33 is absent to the remaining of this field when the shield 33 is present. In a more general definition, it is the ratio of the response of the sensor element $R_0, R_1, \ldots, R_{n-1}$ without the shield 33 to the response of the sensor element $R_0, R_1, \ldots, R_{n-1}$ in the vicinity of the shield 33. Using the latter definition, any direct effect of the shield on the response of the sensor element $R_0, R_1, \ldots,$ $R_{n-1}$ is included too. An example of the latter may for example be the reduction of the shape anisotropy of the sensor element $R_0, R_1, \ldots, R_{n-1}$ by the mirror image of the sensor element $R_0, R_1, \ldots, R_{n-1}$ in the soft-magnetic shield.

In order to tune the sensitivity, the shielding factor F may be varied. This may be done by for example tuning the geometry of the shield 33. This will be explained hereinafter.

FIGS. 11 and 12 respectively show a side view and a top view of a sensor element/shield system 35 according to an embodiment of the invention. FIG. 11 explains the functioning of the shield 33. The sensor element/shield system 35 is exposed to a global applied field $H_{app}$. The field magnetizes the shield 33 and in turn the magnetized shield creates a demagnetizing field $H_D$ in the direction opposite to the magnetization direction. The sensor element $R_0, R_1, \ldots, R_{n-1}$ is thus exposed to a resultant field $H_{app\_sens}$ that is the sum of $H_{app}$ and $H_D$:

$$H_{app\_sens} = H_{app} + H_D = H_{app} - N_{shield}M_{shield} = H_{app} - N_{shield}H_{i\_shield}\chi_{shield} \quad (16)$$

in which $N_{shield}$, $\chi_{shield}$ and $M_{shield}$ respectively are the demagnetizing factor, the susceptibility and the magnetization of the shield 33 and wherein $H_{i\_shield}$ denotes the internal field in the shield 33. Equation (16) is only valid when the shield 33 is positioned at such small distances from the magnetic sensor element $R_0, R_1, \ldots, R_{n-1}$ that the distance loss is negligible. For example, when a shield 33 has a width of 40 μm, a thickness of 2 μm and a susceptibility of 2000, the distance between the shield 33 and the sensor element $R_0, R_1, \ldots, R_{n-1}$ should be 20 nm or smaller in order to allow the use of equation (16).

The field due to the magnetization of the sensor element $R_0, R_1, \ldots, R_{n-1}$ may be neglected (accurate for a relatively thin sensor) for the time being. Because the sensor element $R_0, R_1, \ldots, R_{n-1}$, in this example, may be placed very close to the shield 33 and the magnetic field is continuous across the shields boundary, it may be said that $H_{app\_sens} \approx H_{i\_shield}$. Hence, equation (16) becomes:

$$H_{app\_sens} = H_{app} - N_{shield}H_{app\_sens}\chi_{shield}; \quad (17)$$

This leads to:

$$H_{app\_sens} = H_{app}/(1 + N_{shield}\chi_{shield}) = H_{app}/F \quad (18)$$

and thus:

$$\rightarrow F = 1 + N_{shield}\chi_{shield} \quad (19)$$

If the distance d between the sensor element $R_0, R_1, \ldots, R_{n-1}$ and the shield 33 becomes significant, then distance loss should be taken into account. By approximating the distance loss by that of a periodic magnetization pattern with a period equal to twice the width of the shield 33, $w_{shield}$, the shielding factor F at small distances $2\pi d < w_{shield}$ becomes:

$$F = \frac{1 + N_{shield}\chi_{shield}}{1 + \pi d N_{shield}\chi_{shield}/w_{shield}} \quad (20)$$

with $N_{shield} \approx t_{shield}/w_{shield}$.

When, alternatively, the rectangular shield is approximated by an ellipse (with same thickness and width as the rectangle), then also an analytical expression can be derived for the distance loss. For relatively small distances, this distance loss is a factor $2/\pi$ less than in the above approximation. The shielding factor F at small distances: $2\pi d < w_{shield}$ then reads:

$$F = \frac{1 + N_{shield}\chi_{shield}}{1 + 2dN_{shield}\chi_{shield}/w_{shield}} \quad (21)$$

It can be shown that expression (21) also holds for, for example, a thin rectangular rod. This originates from the fact that the demagnetizing field everywhere in a thin ellipsoidal rod and the field in a thin rectangular rod are opposite to the applied field but equal in magnitude when $N_{shield}\chi_{shield} \gg 1$. Hence, both demagnetizing fields are equal and consequently also the charge densities are equal. Due to equal charge densities in rectangular and ellipsoidal rod, also the fields outside the rods must be equal.

In the above calculations, it is assumed that the shield 33 is not saturated, because when saturation occurs, susceptibility becomes zero and consequently the shield effect disappears. The condition for not being saturated may be given by:

$$N_{shield} > \frac{H_{app}}{M_s} - \frac{1}{\chi} \text{ or } w_{shield} < w_{shield\_sat}, \quad (22)$$

in which:

$$w_{shield\_sat} = \frac{t_{shield}}{\frac{H_{app}}{M_s} - \frac{1}{\chi}} \quad (23)$$

and wherein $w_{shield\_sat}$ is defined as the shield width above which saturation occurs.

When the reduction of the demagnetizing effect the sensor element $R_0, R_1, \ldots, R_{n-1}$ due to the reflection of the sensor element $R_0, R_1, \ldots, R_{n-1}$ in the soft-magnetic shield is taken into account, the shielding factor F then equals:

$$F = \frac{1 + N_{shield}\chi_{shield}}{1 + (2d/w_{shield})N_{shield}\chi_{shield}} \times \frac{(4d/w_{sensor})H_{dem0} + H_K}{H_{dem0} + H_K} \quad (24)$$

assuming that $d < w_{sensor}/4\pi$, and that $\chi_{shield}t_{shield}/w_{sensor} \gg 1$, and wherein:

$$H_K = 2K/(\mu_0 M_s) \quad (25)$$

in which $H_K$ is the anisotropy field of the sensor.

For a simple sensor element structure applies:

$$H_{dem0} = (t_{sensor}/w_{sensor})M_{s\_sensor} \quad (26)$$

In equation (24), the numerator of the first term describes the field reduction factor close to a bare shield 33. The first denominator describes the reducing effect of shielding on a larger distance. The second term describes the reducing effect on shielding due to decreased shape anisotropy of the sensor element $R_0, R_1, \ldots, R_{n-1}$. For sensor elements $R_0, R_1, \ldots, R_{n-1}$ with a free layer having a thickness of, for example, a few nm or less, this latter effect may usually be negligible.

Figure 13:
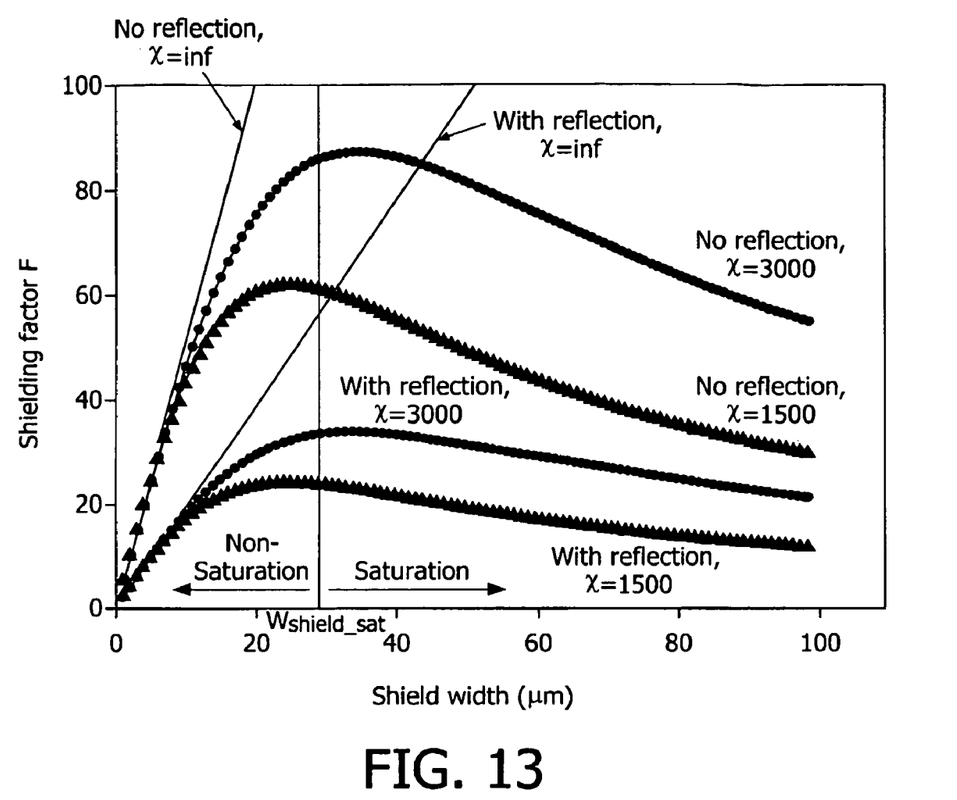
FIG. 13 is a graph illustrating the shielding factor F versus the width of the shield for the shield-sensor device as shown in FIG. 12 and FIG. 13.

To vary the shielding factor F for different sensor elements $R_0, R_1, \ldots, R_{n-1}$ in the sensor device 30, separate shields 33 with different shielding factors F may be required for the different sensor elements $R_0, R_1, \ldots, R_{n-1}$. It is apparent that among different parameters that influence F, such as for example thickness, width, susceptibility, the widths of the sensor elements $R_0, R_1, \ldots, R_{n-1}$ and the shield 33 are the easiest parameters to change from a fabrication-process point of view. In FIG. 13, an example is given, in which the shielding factor F is plotted versus the shield width for $\chi_{shield}=\infty$, 3000 and 1500, respectively. For each susceptibility ($\infty$, 3000 and 1500), the shielding factor F is calculated for two cases, i.e. with and without reflection effect. In the calculation the following is assumed: $t_{shield}=2$ μm, $M_{s\_shield}=800$ kA/m, d=0.1 μm, $t_{sensor}=0.005$ μm, $w_{sensor}=5$ μm, $M_{s\_sensor}=800$ kA/m and $H_K=400$ A/m.

For the condition where the shield 33 is not saturated, the assumed $H_{app}=56$ kA/m (700 Oe) is of importance. For this field value the shield 33 is not saturated when the shield width is less than $w_{shield\_sat}=29$ μm. For the 2 μm thick shield a shielding factor of the order of tens is easily obtainable in a controllable way, without the influence of shield susceptibility or saturation.

An advantage of this method is that with a certain combination of the shield geometry the shielding factor F can easily be made independent of $\chi_{shield}$. For this to be true, it is necessary that:

$$2dN_{shield}\chi_{shield}/w_{shield}=2dt_{shield}\chi_{shield}/w_{shield}^2 \gg 1, \quad (27)$$

so that $$F = \frac{w_{shield}}{2d} \times \frac{(4d/w_{sensor})H_{dem0} + H_K}{H_{dem0} + H_K} \quad (28)$$

In FIG. 13, this situation occurs at small values for $w_{shield}$, for example below ~10 μm for the upper set of curves, at which F is not significantly dependent on the shield's susceptibility.

Hence, by using a magnetic shield 33, depending on the shield geometry only by choosing a sufficiently high but still practically realizable permeability, the sensitivity of the sensor elements $R_0$, $R_1$, . . . , $R_{n-1}$ can be reduced about 1 to 2 orders of magnitude further in a fully controllable way.

In current sensors based on the magneto-resistance effect, a conductor line 36 may be placed in the vicinity of a sensor element $R_0$, $R_1$, . . . , $R_{n-1}$. The conductor line 36 generates a field at the location of the sensor element $R_0$, $R_1$, . . . , $R_{n-1}$ which is proportional to the current. The field generated at the sensor element $R_0$, $R_1$, . . . , $R_{n-1}$ is inversely proportional to the width of the conductor line 36, assuming that the distance between the sensor element $R_0$, $R_1$, . . . , $R_{n-1}$ and the conductor line 36 is fixed. Therefore, to reduce the sensitivity of the sensor element $R_0$, $R_1$, . . . , $R_{n-1}$, one can reduce the field applied to the sensor element $R_0$, $R_1$, . . . , $R_{n-1}$ by widening the conductor line width. The widening of the conductor line 36 width in current sensors has the same purpose as the shield 33 in magnetic field sensors, as described above.

The sensitivity of a sensor element $R_0$, $R_1$, . . . , $R_{n-1}$ in case of a current sensor may be further reduced by splitting the current into a number of parallel conduction paths, among which only one path is allowed to flow close to the sensor element $R_0$, $R_1$, . . . , $R_{n-1}$. The current that flows near the sensor element $R_0$, $R_1$, . . . , $R_{n-1}$ is therefore reduced, causing a reduction of the field applied to the sensor element $R_0$, $R_1$, . . . , $R_{n-1}$ and therefore its sensitivity to the (total) current is reduced. The current that flows near the sensor element $R_0$, $R_1$, . . . , $R_{n-1}$ can be expressed as:

$$I_{sensor} = I_{measured}/(1+R/R_{by-pass}); \quad (29)$$

in which $I_{sensor}$ and $I_{measured}$ are the currents flowing in the proximity of the sensor element $R_0$, $R_1$, . . . , $R_{n-1}$ and the total current to be measured, respectively. R and $R_{by-pass}$ are the resistances of the conduction path that flows in the proximity of the sensor element $R_0$, $R_1$, . . . , $R_{n-1}$ and that of the by-pass route.

This method has much in common with the previous method of using a wider current conductor.

According to different embodiments of the invention, any one or a combination of the above discussed ways for tuning the sensitivity of a sensor element $R_0$, $R_1$, . . . , $R_{n-1}$ can be used to obtain sensor elements $R_0$, $R_1$, . . . , $R_{n-1}$ with different sensitivities on the same substrate. The sensitivity of the sensor elements $R_0$, $R_1$, . . . , $R_{n-1}$ must be well tuned according to the calculations above so that they result in a log function characteristic when their signals are added up.

Hereinafter, different examples concerning the ways to tailor the sensitivity for both magnetic field and current sensors are presented. The different examples are described by means of TMR sensors. However, it should be understood that other types of magneto-resistive sensor elements may also be applied, such as for example GMR or AMR-based sensors.

First, different possible sensor configurations for magnetic field sensors will be described.

Figure 14:
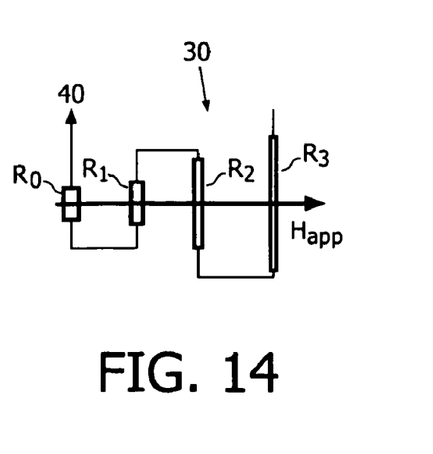
FIGS. 14 to 17 show schematic illustrations of different embodiments that may be applied to field sensors.

In a first example, a sensor device 30 may comprise four sensor elements $R_0$ to $R_3$ which are connected in series (see FIG. 14). In this example, the geometry of the sensor elements $R_0$ to $R_3$ is varied so that they may have different sensitivities but they all have the same resistance (at zero field). Since TMR sensor elements were assumed, the sensor areas must be equal, so that equal resistances are obtained. The equal resistance is of importance for obtaining an optimal logarithmic sensor, as was already described above.

Figure 15:
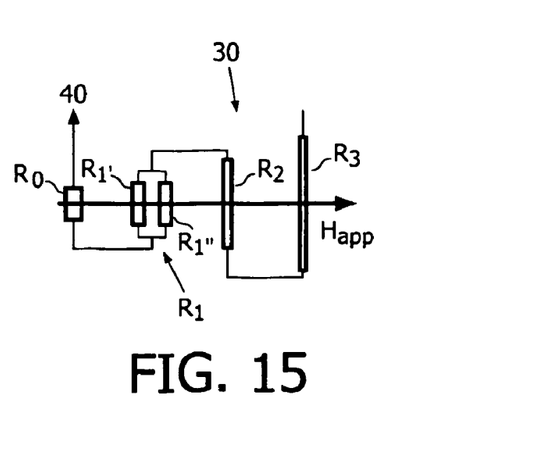

In a second example, which is illustrated in FIG. 15, the sensor device 30 is similar to the first example, but one or more sensor elements $R_0$ to $R_3$ may be split into a number of sub-elements connected in parallel. It has, however, to be understood that in other embodiments according to the invention, the sub-elements may also be connected in series. In the example given in FIG. 15, sensor element $R_1$ is split into 2 parallel sub-elements $R_1'$ and $R_1''$. Splitting of at least one of the sensor elements $R_0$ to $R_3$ gives more freedom of tuning sensitivity and area (for tuning resistance) simultaneously. The sub-elements $R_1'$ and $R_1''$ preferably may have identical dimensions, because the same saturation field is required and therefore the sub-elements $R_1'$ and $R_1''$ need equal shape anisotropy.

Figure 16:
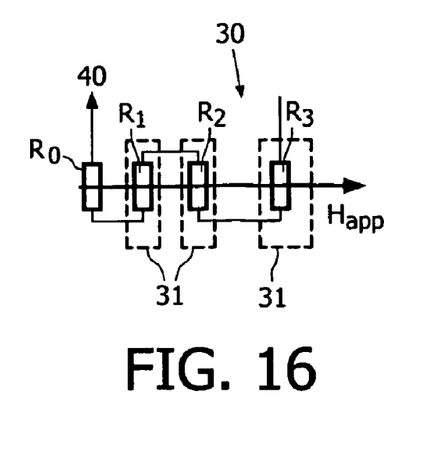

In a third example of magnetic field sensors, alternatively, sensitivity may be varied by placing shields 33, having different shielding factors, in the proximity of the sensor elements $R_0$ to $R_3$ (see FIG. 16). In this case the sensor elements $R_0$ to $R_3$ may have the same dimensions. Normally the first sensor element $R_0$ is not shielded because, according to the present invention, it must have the highest sensitivity.

Figure 17:
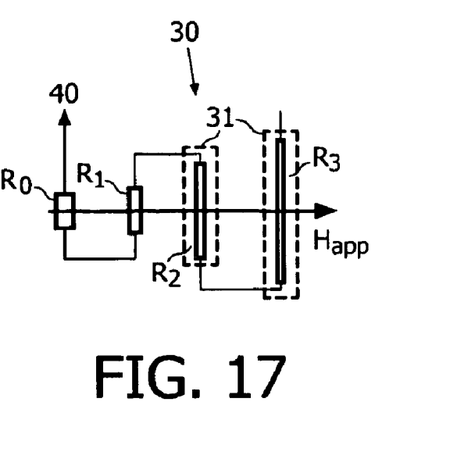

A preferred configuration for a magnetic field sensor is illustrated as a fourth example in FIG. 17. This example is the most practical design because it combines both variations in geometry and shielding effect, hence giving maximum freedom for tuning the sensitivity of the sensor elements $R_0$ to $R_3$. Splitting of some elements, as in described in the second example may also applied in this example.

In FIG. 14 to 17, reference number 40 denotes the sensing current.

Next, some examples of possible configurations for current sensors are described and illustrated in FIG. 18 to 21.

Figure 18:
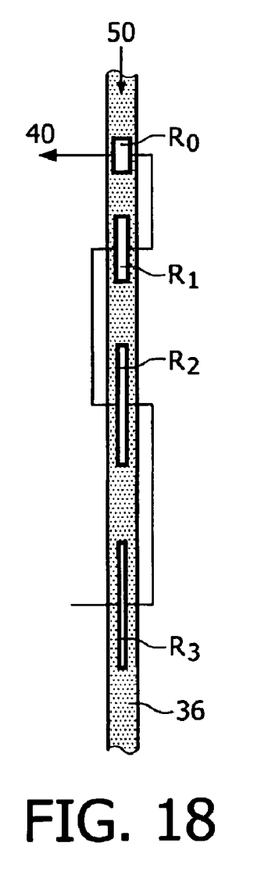
FIGS. 18 to 21 show schematic illustrations of different embodiments for current sensors.

In a first example, the sensor device 30 may comprise four sensor elements $R_0$ to $R_3$ connected in series (FIG. 18). The sensor elements $R_0$ to $R_3$ may have different geometries thus resulting in different field sensitivities. Under the sensor elements $R_0$ to $R_3$ there is an isolated conductor line 36 with a constant width in which flows the current to be measured (denoted by reference number 50). The conductor line 36 generates a magnetic field at the location of the sensor elements $R_0$ to $R_3$. Field values at different sensor elements $R_0$ to $R_3$ are the same, therefore the current sensitivity is only determined by the geometry of the sensor elements $R_0$ to $R_3$. It should be noted that for a current sensor, there are two different types of sensitivity, i.e. field sensitivity is the sensitivity of the sensor to any applied field, and current sensitivity is the sensitivity of the sensor to the current to be measured, i.e. the ratio signal voltage/current. In this first example, the sensor elements $R_0$ to $R_3$ may have different geometries as can be seen from FIG. 18.

Figure 19:
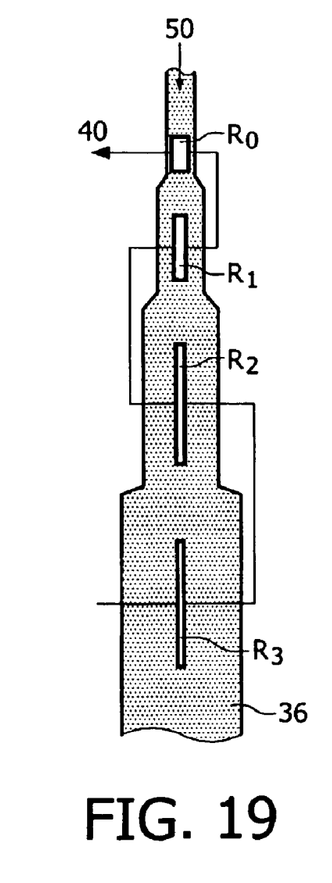

The sensor device 30 illustrated in FIG. 19 is similar to the sensor device 30 of the first example, but the width of the conductor line 36 may be varied at different locations, resulting in different fields applied to different sensor elements $R_0$ to $R_3$. The combination of the variations in geometry and conductor line width gives more freedom for tuning the current sensitivity of the sensor elements $R_0$ to $R_3$.

Figures 20, 21:
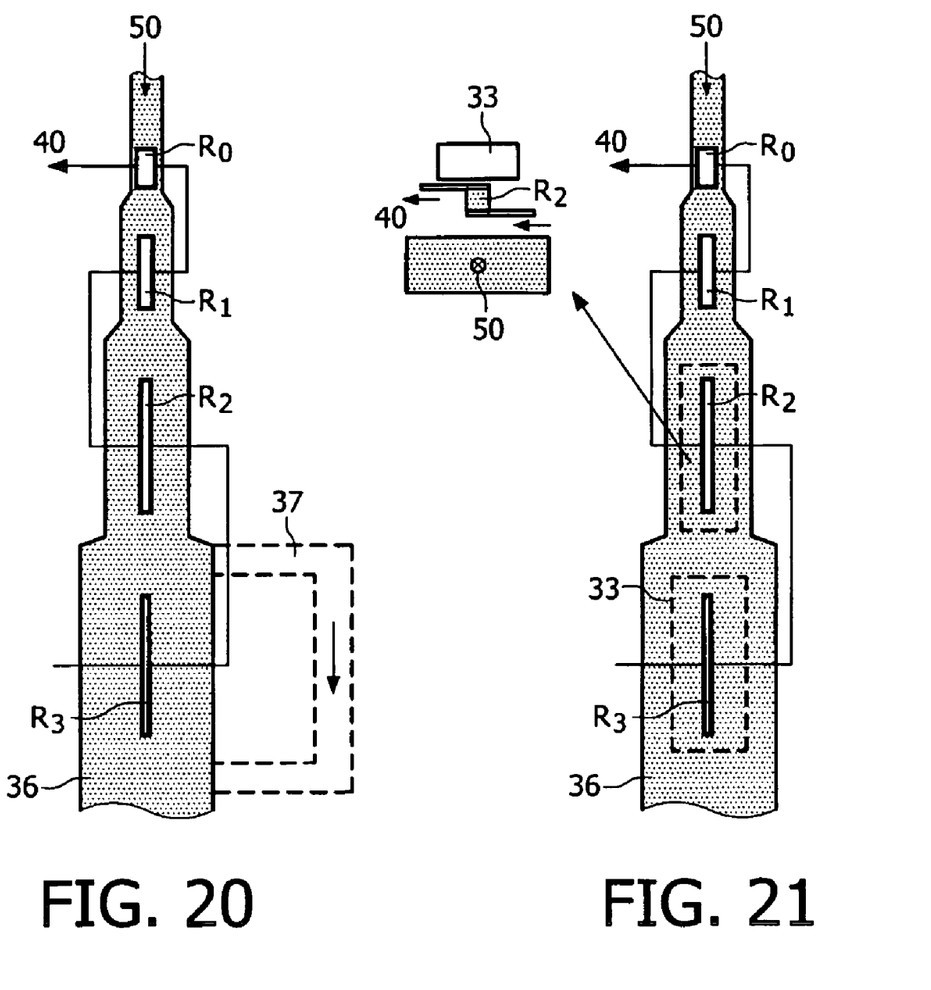

In a current sensor device 30 according to a third example, the current to be measured 50 may be split into several parallel conduction paths, called by-pass current path 37, at the location of at least one sensor element $R_0$ to $R_3$ where the current sensitivity needs to be very small, among which only one path flows in the proximity of the element. For applications where IC fabrication is used, such as for example for integrated current sensor, the by-pass current path 37 may preferably be located at a different interconnect level so that the lateral area of the whole system remains small.

In a fourth example, a combination of geometry, conductor width and shielding is used. Furthermore, splitting the conduction path as in the previous example and splitting sensor elements $R_0$ to $R_3$ as was discussed in the second example of the magnetic field sensors may also be applied (not shown).

In FIG. 18 to 21, reference number 40 denotes the sense current.

The above described examples are not limiting to the invention as it can be understood that also different combinations of sensor elements $R_0, R_1, \ldots, R_{n-1}$ may be applied. Furthermore, the sensor device 30 according to the invention may comprise any number of sensor elements $R_0, R_1, \ldots, R_{n-1}$.

The sensor device 30 according to the invention can exhibit a linear relationship between the sensor signal and the logarithm of the magnetic field or current to be measured. The sensor device 30 according to the invention may be applied as discrete magnetic field sensor which can sense a wide dynamic range of field over several decades and as discrete current sensor which can sense a wide dynamic range of current. The sensor device 30 of the invention may furthermore be applied as integrated current sensor which can sense a wide dynamic range of current and in any application that need to sense non-invasively a current which is converted from a quantity to be measured and this quantity varies exponentially e.g. with time.

It has to be understood that the examples given in the above description are not limiting to the invention. Any possible combination of the described methods for tuning the sensitivity $S_0, S_1, \ldots, S_{n-1}$ of magnetic sensor elements $R_0, R_1, \ldots, R_{n-1}$ may used according to the invention to obtain a sensor device having an output signal showing a quasi linear relationship between the sensor signal and the logarithm of the measured property, for example a magnetic field or current.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A sensor device (30) comprising:
at least two magnetic sensor elements (R0, R1, ..., Rn−1) connected in series or in parallel, each magnetic sensor element (R0, R1, ..., Rn−1) having a sensitivity (S0, S1, ..., Sn−1), wherein the sensitivity (S0, S1, ..., Sn−1) of each magnetic sensor element (R0, R1, ..., Rn−1) differs from the sensitivity (S0, S1, Sn−1) of any other magnetic sensor element (R0, R1, ..., Rn−1), each of the at least two magnetic sensor elements (R0, R1, ..., Rn−1) outputs a sensor signal over a rang of a sensed parameter, and a sum of each of the sensor signals of the at least two magnetic sensor elements (R0, R1, ..., Rn−1) fits a non-linear function of the sensed parameter over the range of the sensor device (30).

2. The sensor device (30) according to claim 1, wherein the non-linear function is a quasi-log function.

3. The sensor device (30) according to claim 1, wherein each of the at least two magnetic sensor elements (R0, R1, ..., Rn−1) have identical geometry and size.

4. The sensor device (30) according to claim 1, wherein at least one of the at least two magnetic sensor elements (R0, R1, ..., Rn−1) has a different geometry and size.

5. The sensor device (30) according to claim 1, wherein at least one of the at least two magnetic sensor elements (R0, R1, ..., Rn−1) is split into at least two sub-elements (R1' and R1") connected to each other in parallel or in series.

6. The sensor device (30) according to claim 5, further comprising:
a conductor line (36) positioned under the at least two magnetic sensor elements (R0, R1, ..., Rn−1).

7. The sensor device (30) according to claim 1, further comprising:
a conductor line (36) positioned under the at least two magnetic sensor elements (R0, R1, ..., Rn−1).

8. The sensor device (30) according to claim 7, wherein said conductor line (36) shows a different width at a position of at least one of the at least two magnetic sensor elements (R0, R1, ..., Rn−1).

9. The sensor device (30) according to claim 1, further comprising:
a bypass current path (37).

10. The sensor device (30) according to claim 1, wherein the device (30) further comprises:
at least one magnetic shield (33).

11. The sensor device (30) according to claim 10, wherein said magnetic shield (33) is placed near at least one magnetic sensor element (R0, R1, ..., Rn−1).

12. A method of manufacturing a sensor device (30), the method comprising:
providing at least two magnetic sensor elements (R0, R1, ..., Rn−1) connected in series or in parallel, each magnetic sensor element (R0, R1, ..., Rn−1) having a sensitivity (S0, S1, ..., Sn−1), whereby the sensitivity (S0, S1, ..., Sn−1) of the at least two magnetic sensor elements (R0, R1, ..., Rn−1) is set such that the sensitivity (S0, S1, ..., Sn−1) of each magnetic sensor element differs from the sensitivity (S0, S1, ..., Sn−1) of any other of the magnetic sensor elements (R0, R1, ..., Rn−1), wherein the sensor device (30) is a non-linear sensor device.

13. The method according to claim 12, wherein the sensor device (30) is a quasi-logarithmic or logarithmic sensor device.

14. The method according to claim 12, wherein setting the sensitivity (S0, S1, . . . , Sn−1) of the at least two magnetic sensor elements (R0, R1, . . . , Rn−1) further comprises:
  changing at least one of geometry and size of the at least two magnetic sensor elements (R0, R1, . . . , Rn−1).

15. The method according to claim 12, wherein setting the sensitivity (S0, S1, . . . , Sn−1) of the at least two magnetic sensor elements (R0, R1, . . . , Rn−1) is performed by further comprises:
  splitting up at least one of the at least two magnetic sensor elements (R0, R1, . . . , Rn−1).

16. The method according to claim 15, wherein setting the sensitivity (S0, S1, . . . , Sn−1) of the at least two magnetic sensor elements (R0, R1, . . . , Rn−1) further comprises:
  providing a magnetic shield (33) near at least one of the at least two magnetic sensor elements (R0, R1, . . . , Rn−1).

17. The method according to claim 12, wherein setting the sensitivity (S0, S1, . . . , Sn−1) of the at least two magnetic sensor elements (R0, R1, . . . , Rn−1) further comprises:
  providing a magnetic shield (33) near at least one of the at least two magnetic sensor elements (R0, R1, . . . , Rn−1).

18. The method according to claim 12, further comprising:
  providing a conductor line (36) under the at least two magnetic sensor elements (R0, R1, . . . , Rn−1).

19. The method according to claim 18, wherein providing a conductor line (36) under at least two magnetic sensor elements (R0, R1, . . . , Rn−1) comprises:
  providing a conductor line (36) having a different width at the position of at least one of the at least two magnetic sensor elements (R0, R1, . . . , Rn−1).

20. A sensor device (30) comprising:
  at least two magnetic sensor elements (R0, R1, . . . , Rn−1) connected in series or in parallel, each magnetic sensor element (R0, R1, . . . , Rn−1) having a sensitivity (S0, S1, . . . , Sn−1), wherein each of the at least two magnetic sensor elements (R0, R1, . . . , Rn−1) outputs a sensor signal over a range of a sensed parameter, and a sum of each of the sensor signals of the at least two magnetic sensor elements (R0, R1, . . . , Rn−1) fits a non-linear function of the sensed parameter over the range of the sensor device (30).

* * * * *